US009601654B2

(12) United States Patent
Nagata et al.

(10) Patent No.: US 9,601,654 B2
(45) Date of Patent: Mar. 21, 2017

(54) METHOD OF PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventors: Kengo Nagata, Kiyosu (JP); Ryo Nakamura, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/922,142

(22) Filed: Oct. 24, 2015

(65) Prior Publication Data

US 2016/0133783 A1 May 12, 2016

(30) Foreign Application Priority Data

Nov. 6, 2014 (JP) ................................ 2014-225960

(51) Int. Cl.
*H01L 33/00* (2010.01)
*H01L 21/02* (2006.01)
*H01L 33/30* (2010.01)
*H01L 33/06* (2010.01)
*H01L 21/205* (2006.01)
*H01L 33/04* (2010.01)

(52) U.S. Cl.
CPC ........ *H01L 33/007* (2013.01); *H01L 21/0254* (2013.01); *H01L 21/0262* (2013.01); *H01L 21/02458* (2013.01); *H01L 21/02507* (2013.01); *H01L 21/2056* (2013.01); *H01L 33/04* (2013.01); *H01L 33/06* (2013.01); *H01L 33/30* (2013.01)

(58) Field of Classification Search
CPC ..... H01L 33/0075; H01L 33/06; H01L 33/32; H01L 33/24; H01L 21/0254; H01L 21/02458; H01L 29/2003; H01L 33/007; H01L 2924/12041; H01L 33/30; H01L 33/0025; H01L 33/0066; H01L 21/2056; H01L 29/452; H01L 29/454; H01L 31/0304; H01L 31/184
USPC ......................................................... 438/47
See application file for complete search history.

(56) References Cited

U.S. PATENT DOCUMENTS

2007/0187713 A1* 8/2007 Kim ........................ H01L 33/44
257/103
2013/0334986 A1* 12/2013 Inoue ...................... H01L 33/32
315/312

FOREIGN PATENT DOCUMENTS

JP        2010-141242 A      6/2010

* cited by examiner

*Primary Examiner* — Thanh T Nguyen
(74) *Attorney, Agent, or Firm* — McGinn IP Law Group, PLLC

(57) ABSTRACT

To provide a Group III nitride semiconductor light-emitting device production method, which is intended to grow a flat light-emitting layer without reducing the In concentration of the light-emitting layer. The method of the techniques includes an n-side superlattice layer formation step, in which an InGaN layer, a GaN layer disposed on the InGaN layer, and an n-type GaN layer disposed on the GaN layer are repeatedly formed. In formation of the InGaN layer, nitrogen gas is supplied as a carrier gas. In formation of the n-type GaN layer, a first mixed gas formed of nitrogen gas and hydrogen gas is supplied as a carrier gas. The first mixed gas has a hydrogen gas ratio by volume greater than 0% to 75% or less.

18 Claims, 8 Drawing Sheets

US 9,601,654 B2

METHOD OF PRODUCING GROUP III NITRIDE SEMICONDUCTOR LIGHT-EMITTING DEVICE

BACKGROUND OF THE INVENTION

Field of the Invention

The present techniques relate to a method for producing a Group III nitride semiconductor light-emitting device, which method can provide a flat light-emitting layer.

Background Art

Group III nitride semiconductor light-emitting devices each have a light-emitting layer which emits light via recombination of an electron and a hole. The light-emitting layer has a well layer and a barrier layer. The barrier layer has a bandgap greater than that of the well layer. Some semiconductor light-emitting devices have a multiple quantum-well (MQW) structure in which well layers and barrier layers are repeatedly deposited.

Thus, such a light-emitting layer generally has a plurality of deposited semiconductor layers. The semiconductor layers forming the light-emitting layer are preferably flat, since a favorable potential profile of a well layer is realized when the light-emitting layer has high flatness. In such a flat light-emitting layer, electrons and holes are more efficiently recombined in a well layer. That is, the higher the flatness of the light-emitting layer, the higher the luminance of the light-emitting device employing the light-emitting layer.

In order to form a flat light-emitting layer, there have been developed some techniques for improving properties of a light-emitting layer, such as crystallinity. For example, Patent Document 1 discloses that hydrogen is added to a semiconductor growth system during interruption of growth of well layers and barrier layers for suppressing segregation of In, whereby the crystallinity of the grown semiconductor is improved (see, paragraph [0006] of Patent Document 1).
Patent Document 1: Japanese Patent Application Laid-Open (kokai) No. 2010-141242

As described in Patent Document 1, segregation of In can be suppressed by adding hydrogen to a semiconductor growth system for forming a light-emitting layer. However, hydrogen sometimes removes In via an etching effect thereof. In such a case, the In concentration of a well layer included in the light-emitting layer varies. As a result, in some cases, the luminance of the light emitted by the light-emitting device decreases, and the wavelength of the emitted light is shifted.

SUMMARY OF THE INVENTION

The present techniques have been conceived for solve the aforementioned problems involved in conventional techniques. Thus, an object of the present techniques is to provide a method for producing a Group III nitride semiconductor light-emitting device (hereinafter may be referred to as a Group III nitride semiconductor light-emitting device production method), which method is intended to grow a flat light-emitting layer without reducing the In concentration of the light-emitting layer.

In a first aspect of the present techniques, there is provided a method for producing a Group III nitride semiconductor light-emitting device, the method including an n-type semiconductor layer formation step of forming an n-type semiconductor layer on a substrate; a light-emitting layer formation step of forming a light-emitting layer on the n-type semiconductor layer; and a p-type semiconductor layer formation step of forming a p-type semiconductor layer on the light-emitting layer. The n-type semiconductor layer formation step includes an n-side superlattice layer formation step of forming an n-side superlattice layer. In the n-side superlattice layer formation step, at least an InGaN layer, a first semiconductor layer on the InGaN layer, a second semiconductor layer on the first semiconductor layer are repeatedly formed. In formation of the InGaN layer, nitrogen gas is supplied as a carrier gas. In formation of the second semiconductor layer, a first mixed gas formed of nitrogen gas and hydrogen gas is supplied as a carrier gas. The ratio by volume of hydrogen gas in the first mixed gas is greater than 0% and 75% or less.

In the Group III nitride semiconductor light-emitting device production method, the n-side superlattice layer having high flatness is formed through epitaxial growth. Therefore, component layers of the light-emitting layer can be grown on the n-side superlattice layer in a flat state. In the growth of the light-emitting layer, incorporation of hydrogen gas into the carrier gas is not required, since hydrogen gas may etch In contained in the light-emitting layer. Thus, when no hydrogen gas is employed as a carrier gas in the growth of the light-emitting layer, the output of the light-emitting device increases. In this production method, a flat light-emitting layer can be formed without employing hydrogen gas as a carrier gas in the growth of the light-emitting layer.

A second aspect of the techniques is directed to a specific embodiment of the Group III nitride semiconductor light-emitting device production method, wherein, in the n-side superlattice layer formation step, nitrogen gas is supplied as a carrier gas in formation of the first semiconductor layer.

A third aspect of the techniques is directed to a specific embodiment of the Group III nitride semiconductor light-emitting device production method, wherein, in the n-side superlattice layer formation step, a second mixed gas formed of nitrogen gas and hydrogen gas is supplied as a carrier gas in formation of the first semiconductor layer. The second mixed gas has a hydrogen gas ratio by volume of greater than 0% and 75% or less.

A fourth aspect of the techniques is directed to a specific embodiment of the Group III nitride semiconductor light-emitting device production method, wherein, in the n-side superlattice layer formation step, the n-side superlattice layer is grown such that the following conditions:

$$0 < A \le 0.75,$$

$$0.167 \times B + 0.033 \le A, \text{ and}$$

$$A \le 0.167 \times B + 0.350,$$

wherein A represents a ratio of hydrogen gas in the carrier gas, and B represents a growth rate (nm/s) of the semiconductor layer, are satisfied.

A fifth aspect of the techniques is directed to a specific embodiment of the Group III nitride semiconductor light-emitting device production method, wherein, in the light-emitting layer formation step, no hydrogen gas but nitrogen gas is supplied as a carrier gas.

The present techniques, disclosed in the specification, provide a Group III nitride semiconductor light-emitting device production method, which method is intended to grow a flat light-emitting layer without reducing the In concentration of the light-emitting layer.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
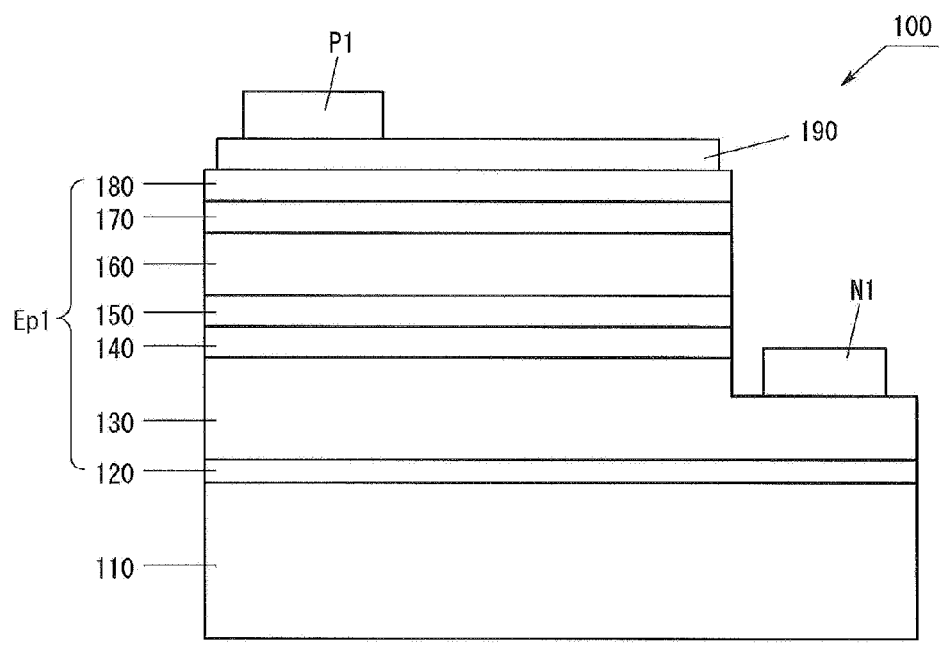
FIG. 1 is a schematic view of the configuration of a light-emitting device of an embodiment.

With reference to the drawings, specific embodiment of the production method for producing a semiconductor light-emitting device as an example will next be described in detail. However, this embodiment should not be construed as limiting the techniques thereto. The below-described depositing configuration of the layers of the semiconductor light-emitting device and the electrode structure are given only for the illustration purpose, and other depositing structures differing therefrom may also be employed. The thickness of each of the layers shown in the drawings is not an actual value, but a conceptual value.

1. Semiconductor Light-Emitting Device

Figure 2:
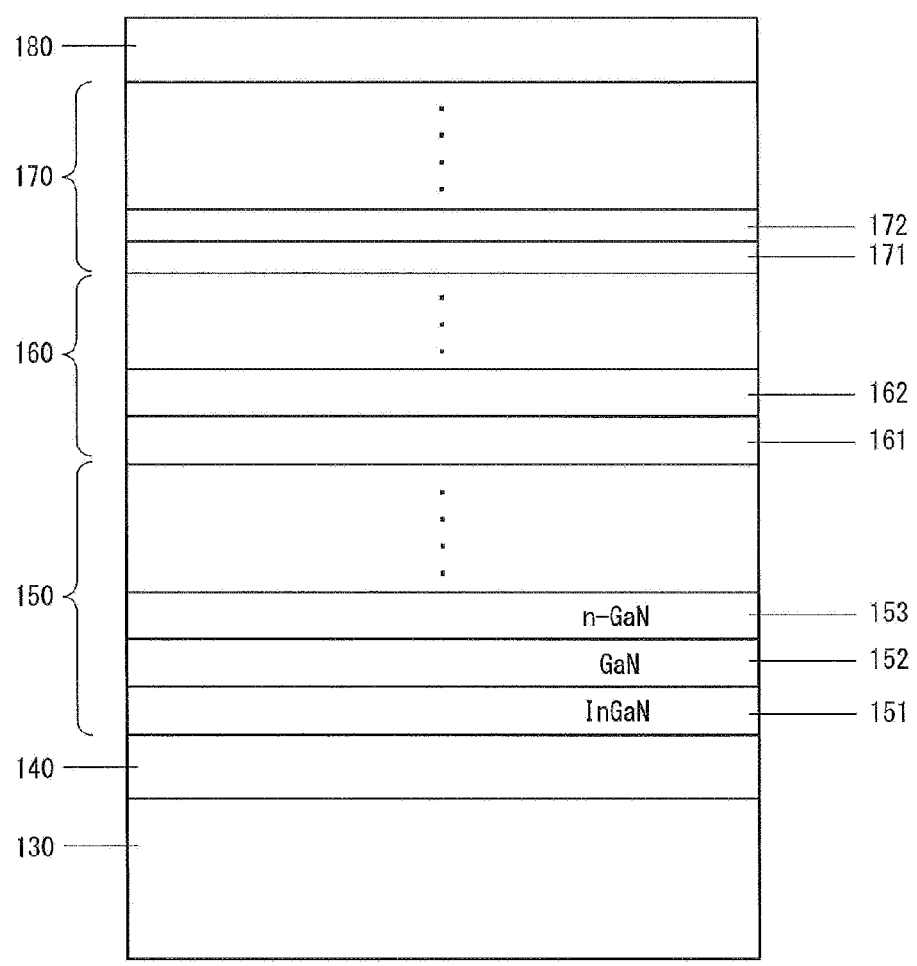
FIG. 2 is a view of the semiconductor layer depositing structure of the light-emitting device of the embodiment.

FIG. 1 is a schematic view of the configuration of a light-emitting device 100 of the embodiment. FIG. 2 is a view of the semiconductor layer depositing structure of the light-emitting device 100. The light-emitting device 100 is a face-up-type semiconductor light-emitting device. The light-emitting device 100 has a plurality of semiconductor layers formed of a Group III nitride semiconductor.

As shown in FIG. 1, the light-emitting device 100 has a substrate 110, a low-temperature buffer layer 120, an n-type contact layer 130, an n-side electrostatic breakdown-preventing layer 140, an n-side superlattice layer 150, a light-emitting layer 160, a p-type cladding layer 170, a p-type contact layer 180, a transparent electrode 190, an n-electrode N1, and a p-electrode P1. The low-temperature buffer layer 120, the n-type contact layer 130, the n-side electrostatic breakdown-preventing layer 140, the n-side superlattice layer 150, the light-emitting layer 160, the p-type cladding layer 170, and the p-type contact layer 180 form a semiconductor layer Ep1. The n-type contact layer 130, the n-side electrostatic breakdown-preventing layer 140, and the n-side superlattice layer 150 are n-type semiconductor layers. The p-type cladding layer 170 and the p-type contact layer 180 are p-type semiconductor layers.

On the main surface of the substrate 110 there is formed the semiconductor layer Ep1, in which the low-temperature buffer layer 120, the n-type contact layer 130, the n-side electrostatic breakdown-preventing layer 140, the n-side superlattice layer 150, the light-emitting layer 160, the p-type cladding layer 170, and the p-type contact layer 180 are successively formed in this order. The n-electrode N1 is formed on the n-type contact layer 130, and the p-electrode P1 is formed on the transparent electrode 190.

The substrate 110 is a growth substrate. On the main surface of the substrate, the aforementioned semiconductor layers are formed through MOCVD. The main surface of the substrate may be roughened. The substrate 110 is made of sapphire. Other than sapphire, materials such as SiC, ZnO, Si, and GaN may be employed.

The low-temperature buffer layer 120 takes over the crystallinity from the substrate 110 and is provided so as to form thereon an upper layer. Thus, the low-temperature buffer layer 120 is disposed on the main surface of the substrate 110. The low-temperature buffer layer 120 is made of, for example, AlN or GaN.

The n-type contact layer 130 is provided so as to establish ohmic contact with the n-electrode N1. The n-type contact layer 130 is disposed on the low-temperature buffer layer 120. On the n-type contact layer 130, the n-electrode N1 is disposed. The n-type contact layer 130 is formed of n-type GaN and has an Si concentration of $1\times10^{18}/cm^3$ or greater. Alternatively, the n-type contact layer 130 may be formed of a plurality of layers having different carrier concentrations for enhancing ohmic contact with the n-electrode N1. The n-type contact layer 130 has a thickness of, for example, 1 µm to 5 µm. Needless to say, no particular limitation is imposed on the thickness.

The n-side electrostatic breakdown-preventing layer 140 serves as an electrostatic breakdown-preventing layer for preventing electrostatic breakdown of the semiconductor layers. The n-side electrostatic breakdown-preventing layer 140 is formed on the n-type contact layer 130. The n-side electrostatic breakdown-preventing layer 140 is a semiconductor layer formed by depositing a non-doped i-GaN layer and an n-type GaN layer. The n-side electrostatic breakdown-preventing layer 140 has a thickness of, for example, 300 nm.

The n-side superlattice layer 150 is a strain relaxation layer for relaxing the stress applied to the light-emitting layer 160. More specifically, the n-side superlattice layer 150 has a superlattice structure. The n-side superlattice layer 150 is disposed on the n-side electrostatic breakdown-preventing layer 140. As shown in FIG. 2, the n-side superlattice layer 150 is formed through repeatedly depositing stack units each formed by depositing an InGaN layer 151, a GaN layer 152, and an n-type GaN layer 153. No particular limitation is imposed on the number of repetitions of depositing, and it is generally 10 to 20.

The GaN layer 152 serves as a first semiconductor layer disposed on the InGaN layer 151. The n-type GaN layer 153 serves as a second semiconductor layer disposed on the first semiconductor layer. The thickness of the InGaN layer 151 is 0.3 nm to 1,000 nm. The thickness of the GaN layer 152 is 0.3 nm to 10 nm. The thickness of the n-type GaN layer 153 is 0.3 nm to 100 nm.

The light-emitting layer 160 emits light through recombination of an electron with a hole. The light-emitting layer 160 is formed on the n-side superlattice layer 150. The light-emitting layer 160 is formed through repeatedly depositing stack units each formed by depositing a barrier layer 161 and a well layer 162. That is, the light-emitting layer 160 has a multiple quantum-well (MQW) structure in which these stack units are repeatedly deposited.

The number of repetitions of depositing is, for example, 5. However, needless to say, no particular limitation is imposed on the repetition times. The barrier layer 161 is, for example, an In-containing InAlGaN layer, and the well layer 162 is, for example, an InGaN layer. Essentially, the well layer 162 contains In. Other than the In-containing InAlGaN layer, another semiconductor layer, such as an AlGaN layer, may be employed as the barrier layer 161.

The barrier layer 161 has a thickness of 1 nm to 10 nm. The thickness of the well layer 162 is 1 nm to 5 nm. These thickness values are given as examples, and values falling outside the ranges may be employed. The total thickness of the light-emitting layer 160 is 500 nm to 700 nm. Needless to say, no particular limitation is imposed on the total thickness.

On the well layer 162, a capping layer may be disposed. The capping layer is, for example, a GaN layer. The capping layer serves as a protective layer which protects the well layer 162 from heat. Specifically, the protective layer prevents sublimation of In in the well layer 162. The thickness of the capping layer is 0.2 nm to 1.8 nm and is preferably 0.2 nm or greater.

The p-type cladding layer 170 is disposed on the light-emitting layer 160. As shown in FIG. 2, the p-type cladding layer 170 is formed through repeatedly depositing a p-type InGaN layer 171 and a p-type AlGaN layer 172. The number of repetitions of depositing is, for example, 5. The In proportion of the p-type InGaN layer 171 is 0.05 to 0.12. The thickness of the p-type InGaN layer 171 is 2 nm. The Al proportion of the p-type AlGaN layer 172 is 0.25 to 0.4. The thickness of the p-type AlGaN layer 172 is 2.5 nm. These values are given as examples, and values falling outside the ranges may be employed. Also, the configuration of the p-type cladding layer 170 may differ from the one described above.

The p-type contact layer 180 is formed on the p-type cladding layer 170. The thickness of the p-type contact layer 180 is 80 nm. The p-type contact layer 180 is doped with Mg at $1 \times 10^{19}/cm^3$ to $1 \times 10^{22}/cm^3$.

The transparent electrode 190 is disposed on the p-type contact layer 180. The material of the transparent electrode 190 is preferably any of ITO, IZO, ICO, ZnO, $TiO_2$, $NbTiO_2$, Ta $TiO_2$, and $SnO_2$.

The p-electrode P1 is disposed on the transparent electrode 190. The p-electrode P1 is formed of an Ni layer and an Au layer, sequentially deposited on the transparent electrode 190.

The n-electrode N1 is disposed on the n-type contact layer 130. The n-electrode N1 is formed of a V layer and an Al layer, sequentially deposited on the n-type contact layer 130. Alternatively, a Ti layer and an Al layer may be sequentially deposited in the same manner. No particular limitation is imposed on the configuration of the n-electrode N1.

The light-emitting device 100 may include a protective film for protecting, for example, the semiconductor layer Ep1.

2. n-Side Superlattice Layer Formation Step

A characteristic feature of the embodiment resides in the n-side superlattice layer formation step. In the n-side superlattice layer formation step, a mixed gas formed of nitrogen gas and hydrogen gas is used as a carrier gas, so long as the carrier gas does not impair the InGaN layer 151. By virtue of hydrogen gas incorporated into the carrier gas, the flatness of the semiconductor layer to be grown; i.e., the n-side superlattice layer 150, can be enhanced.

Figure 3:
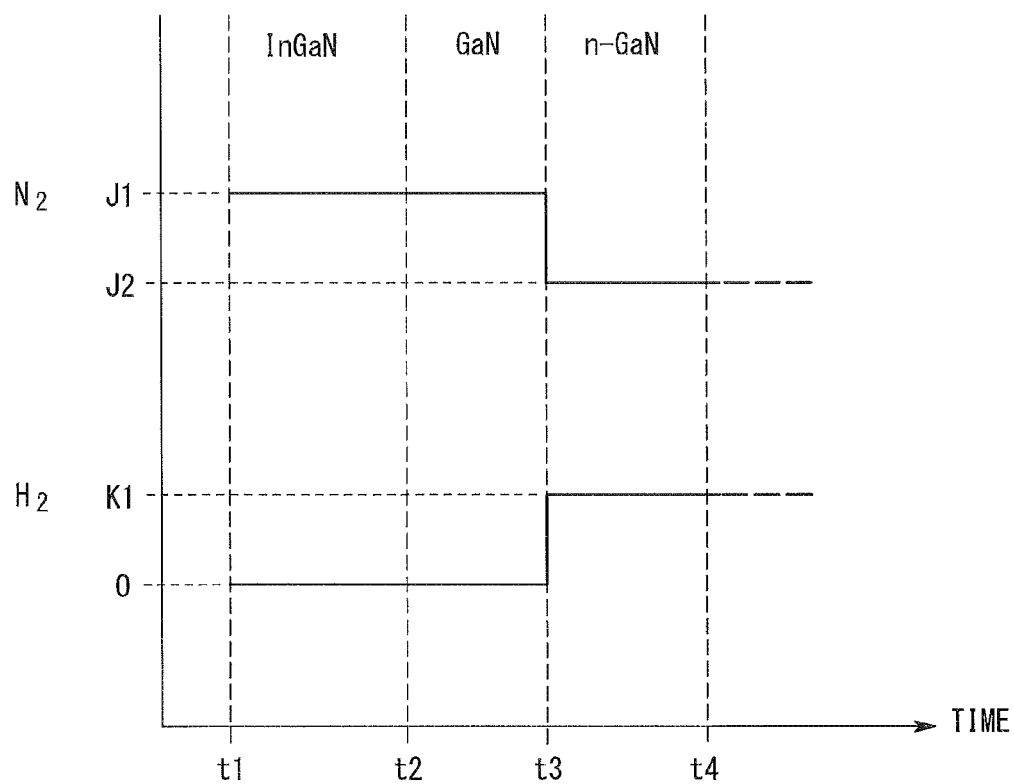
FIG. 3 is a timing chart showing the compositional ratio of the carrier gas in formation of the n-side superlattice layer employed in the embodiment.

As shown in FIG. 3, the carrier gas employed in the growth of the InGaN layer 151 and the GaN layer 152 is nitrogen gas. In the above growth, the nitrogen gas supply is J1, and the hydrogen gas supply is zero. In the growth of the n-type GaN layer 153, the employed carrier gas is a mixed gas formed of nitrogen gas and hydrogen gas. In this growth process, the nitrogen gas supply is J2, and the hydrogen gas supply is K1. J1 is greater than J2, and K1 is a positive value.

Thus, in the growth of the InGaN layer 151 and the GaN layer 152, no hydrogen gas is used as a carrier gas. In the growth of the n-type GaN layer 153, hydrogen gas is used as a carrier gas. Such selection of the carrier gas is employed, since hydrogen gas may possibly etch In on the relevant semiconductor layer. Therefore, in the growth of the GaN layer 152 for protecting the InGaN layer 151 and the InGaN layer 151, no hydrogen gas is used as a carrier gas.

Figure 4:
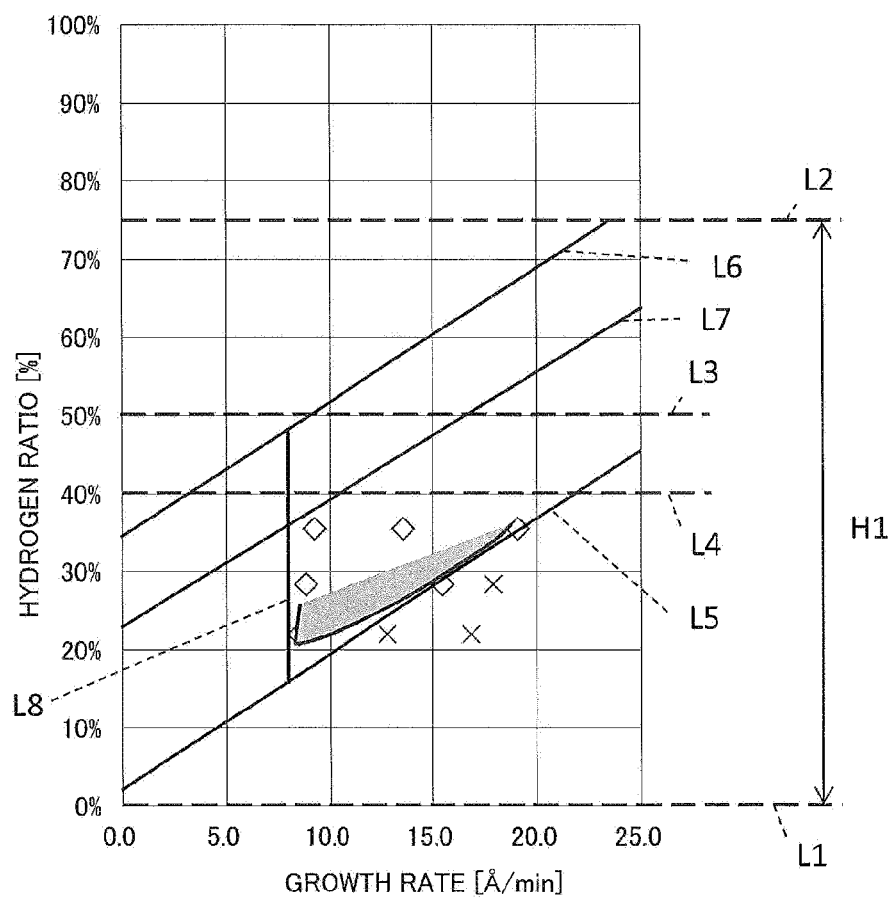
FIG. 4 is a graph showing the relationship between the growth rate in formation of the semiconductor layer and the hydrogen gas ratio of the carrier gas in the embodiment.

2-1. Hydrogen Concentration of Carrier Gas in n-Side Superlattice Layer Formation Step In the embodiment, as described above, a mixed gas formed of nitrogen gas and hydrogen gas is used as a carrier gas in the growth of the n-type GaN layer 153. The hydrogen gas ratio A of the carrier gas is greater than 0% and 75% or less. The ratio A is represented by the following formula:

$$0 < A \leq 0.75 \qquad (1)$$

wherein A represents a ratio of hydrogen gas in the carrier gas. The conditions correspond to the area H1 shown in the graph of FIG. 4. In FIG. 4, the area H1 is defined by lines L1 and L2.

The hydrogen gas ratio A of the carrier gas is preferably greater than 0% and 50% or less. The conditions correspond to the area defined by lines L1 and L3. The hydrogen gas ratio A of the carrier gas is more preferably greater than 0% and 40% or less. The conditions correspond to the area defined by lines L1 and L4.

2-2. Relationship Between Hydrogen Concentration of Carrier Gas and Growth Rate in n-Side Superlattice Layer Formation Step Generally, hydrogen gas promotes migration of semiconductor material elements (e.g., Ga). Thus, hydrogen gas can provide a to-be-grown semiconductor layer with a flat surface. When the growth rate is fast, the relevant semiconductor layer is rapidly formed before completion of leveling of the semiconductor layer surface. Therefore, in the case of high growth rate, hydrogen gas concentration is preferably increased.

Also, the relationship between the hydrogen concentration of the carrier gas and the growth rate employed in the growth of the n-side superlattice layer 150 is preferably represented by the area R1 shown in FIG. 4. The area R1 satisfies the following relationships:

$$0 < A \leq 0.75 \qquad (1),$$

$$0.167 \times B + 0.033 \leq A \qquad (2), \text{ and}$$

$$A \leq 0.167 \times B + 0.350 \qquad (3),$$

wherein A represents a ratio of hydrogen gas in the carrier gas, and B represents a growth rate (nm/s) of the semiconductor layer. Thus, in the n-side superlattice layer formation step, the n-side superlattice layer 150 is preferably grown so as to satisfy the relationships (1) to (3).

The area R1 in FIG. 4 is defined by lines L1, L2, L5, and L6. Line L5 defines the case where equality of formula (2)

is established. Line L6 defines the case where equality of formula (3) is established. When the area R1 is ensured, the surface of a relevant semiconductor layer can be flattened at any semiconductor layer growth rate. Alternatively, an area defined by lines L1, L2, L5, and L7 may be acceptable. Line L7 is defined by the following formula:

$$A=0.167 \times B+0.225.$$

Thus, the following formula:

$$A \leq 0.167 \times B+0.225$$

is employed instead of formula (3).

The semiconductor layer growth rate preferably satisfies the following formula:

$$0.8 \text{ nm/min} \leq B \qquad (4)$$

wherein B represents a growth rate (nm/s) of the semiconductor layer. In this case, high semiconductor light-emitting device productivity can be attained. Line L8 in FIG. 4 defines the case where equality of formula (4) is established.

2-3. Effects of n-Side Superlattice Layer Formation Step

In this embodiment, the n-side superlattice layer 150 having high flatness is formed. By virtue of such high flatness, the upper semiconductor layers forming the light-emitting layer 160 can also be formed and provided with flatness. In other words, the light-emitting layer 160 with high flatness can be formed, without incorporating hydrogen gas into the carrier gas employed in the growth of the light-emitting layer 160. As described above, since hydrogen gas may etch In, use of hydrogen gas is preferably avoided in formation of the light-emitting layer 160 including an InGaN layer or the like. In this embodiment, through providing the n-side superlattice layer 150 with high flatness, the light-emitting layer 160 is provided with high flatness. Also, in the growth of the light-emitting layer 160, hydrogen gas is not used.

In the growth of the GaN layer 152 on the InGaN layer 151, no hydrogen gas is used, since etching of In present at the surface of the InGaN layer 151 can be favorably prevented. In other words, the GaN layer 152 serves as a protective layer for protecting the surface of the InGaN layer 151.

3. Method for Producing Semiconductor Light-Emitting Device

Next will be described the method of this embodiment for producing the light-emitting device 100. The production method includes an n-type semiconductor layer formation step of forming an n-type semiconductor layer on a substrate; a light-emitting layer formation step of forming a light-emitting layer on the n-type semiconductor layer; and a p-type semiconductor layer formation step of forming a p-type semiconductor layer on the light-emitting layer. The n-type semiconductor layer formation step includes an n-side superlattice layer formation step of forming an n-side superlattice layer.

The semiconductor layers are formed through metalorganic chemical vapor deposition (MOCVD), whereby the semiconductor layers are produced via epitaxial growth. Examples of the carrier gas employed in the growth of semiconductor layers include hydrogen ($H_2$), nitrogen ($N_2$), and a mixture of hydrogen and nitrogen ($H_2+N_2$). Ammonia gas ($NH_3$) is used as a nitrogen source, and trimethylgallium ($Ga(CH_3)_3$) as a gallium source. Trimethylindium ($In(CH_3)_3$) is used as an indium source, and trimethylaluminum ($Al(CH_3)_3$) is used as an aluminum source. Silane ($SiH_4$) is used as an n-type dopant gas, and biscyclopentadienylmagnesium ($Mg(C_5H_5)_2$) is used as a p-type dopant gas.

3-1. n-Type Contact Layer Formation Step

Firstly, the low-temperature buffer layer 120 is formed on the main surface of the substrate 110. Then, the n-type contact layer 130 is formed on the buffer layer 120. The substrate temperature in the epitaxial growth is 1,080° C. to 1,140° C. The dopant Si concentration is $1 \times 10^{18}/cm^3$ or greater.

3-2. n-Side Electrostatic Breakdown-Preventing Layer Formation Step

Subsequently, the n-side electrostatic breakdown-preventing layer 140 is formed on the n-type contact layer 130. The substrate temperature in the epitaxial growth is 750° C. to 950° C.

3-3. n-Side Superlattice Layer Formation Step

Then, the n-side superlattice layer 150 is formed on the n-side electrostatic breakdown-preventing layer 140. Firstly, an InGaN layer 151 is formed on the n-side electrostatic breakdown-preventing layer 140. Subsequently, as shown in FIG. 2, the GaN layer 152 is formed on the InGaN layer 151, and the n-type GaN layer 153 is formed on the GaN layer 152. Thus, a stack unit formed consisting of the InGaN layer 151, the GaN layer 152, and the n-type GaN layer 153 is yielded, and the unit is repeatedly formed.

In the growth of the InGaN layer 151, nitrogen gas is supplied as a carrier gas. In the growth of the GaN layer 152, nitrogen gas is supplied as a carrier gas. The GaN layer 152 serves as a first semiconductor layer disposed on the InGaN layer 151. In the growth of the n-type GaN layer 153, a first mixed gas formed of nitrogen gas and hydrogen gas is supplied as a carrier gas. The n-type GaN layer 153 serves as a second semiconductor layer disposed on the first semiconductor layer.

In the above growth, the first mixed gas has a hydrogen gas ratio by volume greater than 0% and 75% or less. That is, the aforementioned formula (1) is satisfied. Preferably, formulas (2) and (3) are satisfied. More preferably, formula (4) is satisfied.

3-4. Light-Emitting Layer Formation Step

Next, the light-emitting layer 160 is formed on the n-side superlattice layer 150. Firstly, the barrier layer 161 and the well layer 162 are deposited in this order, to thereby yield a stack unit, and the stack unit is repeatedly deposited. Thus, the light-emitting layer formation step includes a barrier layer formation step of forming the barrier layer 161 and a well layer formation step of forming the well layer 162 on the barrier layer 161. These steps are repeatedly carried out. The substrate temperature at the growth of the barrier layer 161 is adjusted to 800° C. to 980° C., and the substrate temperature at the growth of the well layer 162 is adjusted to 730° C. to 850° C. In the light-emitting layer formation step, nitrogen gas is supplied as a carrier gas instead of hydrogen gas.

3-5. p-Type Cladding Layer Formation Step

Then, the p-type cladding layer 170 is formed on the light-emitting layer 160. In this step, the p-type InGaN layer 171 and the p-type AlGaN layer 172 are repeatedly deposited.

3-6. p-Type Contact Layer Formation Step

Figure 5:
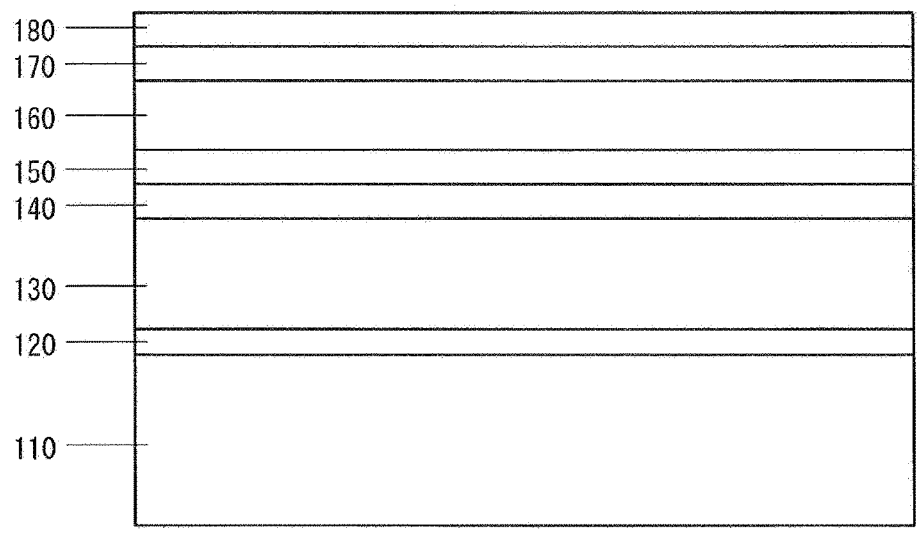
FIG. 5 is a view (1) showing the embodiment of the light-emitting device production method.

Then, the p-type contact layer 180 is formed on the p-type cladding layer 170. The substrate temperature is adjusted to 900° C. to 1,050° C. Through the aforementioned steps, the semiconductor component layers are deposited on the substrate 110. FIG. 5 shows the layer configuration of the deposited semiconductor layers.

3-7. Transparent Electrode Formation Step

Then, the transparent electrode 190 is formed on the p-type contact layer 180. The technique of formation may be sputtering or vapor deposition.

3-8. Electrode Formation Step

Figure 6:
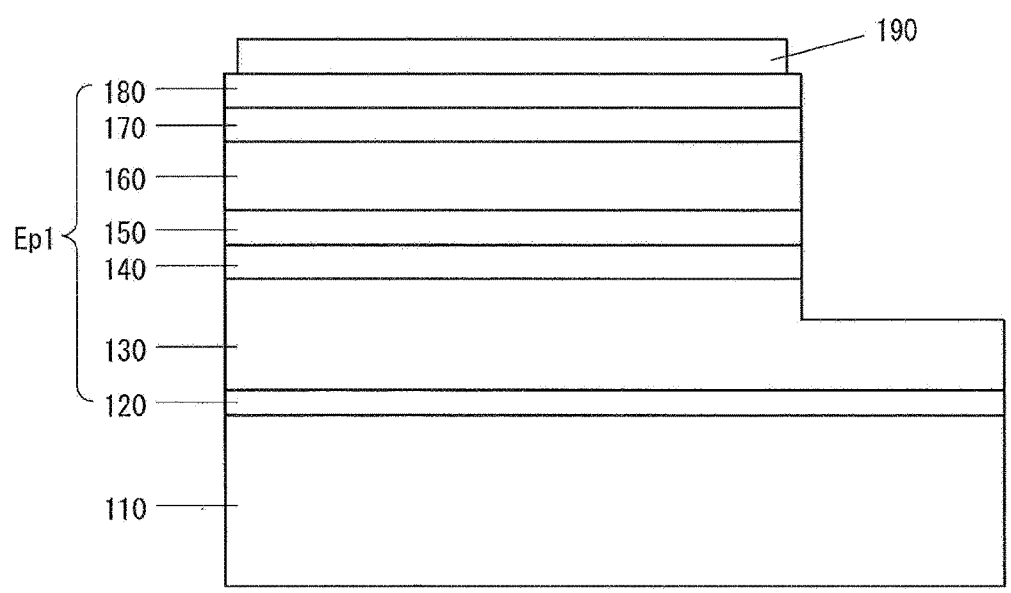
FIG. 6 is a view (2) showing the embodiment of the light-emitting device production method.

As shown in FIG. 6, the semiconductor layers are partially removed through laser radiation or etching from the p-type contact layer 180 side, to thereby expose the n-type contact layer 130. Then, the n-electrode N1 is formed on the thus-exposed region, and the p-electrode P1 is formed on the transparent electrode 190. Either of the p-electrode P1 formation step and the n-electrode N1 formation step may be performed first.

3-9. Other Steps

In addition to the aforementioned steps, additional steps such as a step of forming a transparent insulating film and a heat treatment step may be carried out. In this way, the light-emitting device 100 shown in FIG. 1 is produced.

4. Experiments 4-1. Hydrogen Gas Ratio

Figure 7:
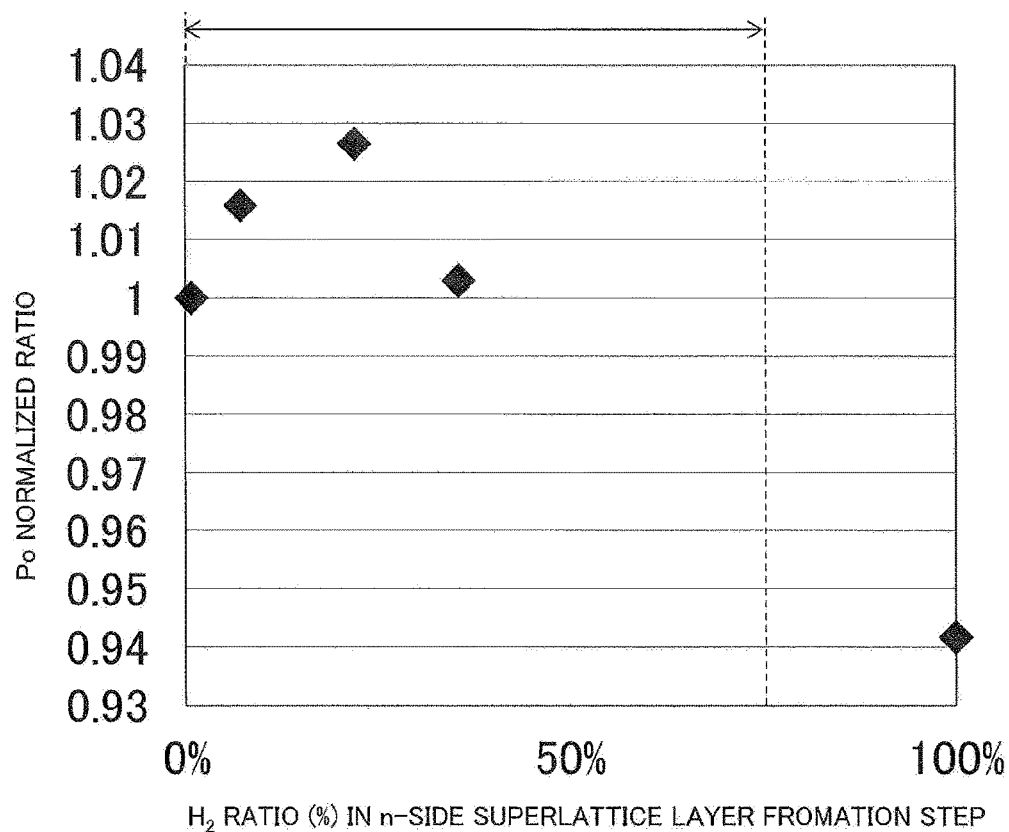
FIG. 7 is a graph showing the relationship between the hydrogen gas ratio of the carrier gas employed in the n-side superlattice layer formation step and the output of the light-emitting device produced through the embodiment of the production method.

FIG. 7 is a graph showing the relationship between the hydrogen gas ratio of the carrier gas employed in the n-side superlattice layer 150 formation step and the output of the produced light-emitting device. In FIG. 7, the horizontal axis denotes the hydrogen gas ratio of the carrier gas, and the vertical axis denotes the total radiant flux Po provided by the light-emitting device 100. The total radiant flux Po is normalized to 1, when the hydrogen gas ratio is 1%. The semiconductor layer growth rate in FIG. 7 is 1 nm/min. Thus, as the growth rate increases, the peak is thought to be shifted to the right in FIG. 7. As shown in FIG. 7, in the growth of the n-side superlattice layer 150, hydrogen gas is preferably added to nitrogen gas. When the hydrogen gas ratio of the carrier gas is greater than 0% and 75% or less, the light-emitting device 100 provides high luminance. When the hydrogen gas ratio of the carrier gas is 1% to 50%, the luminance provided by the light-emitting device 100 is higher.

4-2. Relationship Between Growth Rate and Hydrogen Gas Ratio

FIG. 4 is a graph showing the relationship between the growth rate and the hydrogen gas ratio of the carrier gas. The horizontal axis denotes the growth rate, and the vertical axis denotes the relative amount of hydrogen gas in the carrier gas (hydrogen gas ratio).

In FIG. 4, diamond-shape symbols each represent a point at which the light-emitting device 100 provides a luminance which is 98% to 100% the maximum output. Within the area R1 in FIG. 4, the light-emitting device 100 provides a luminance which is 98% to 100% the maximum output.

Symbols X each represent a point at which the light-emitting device 100 provides a luminance which is 95% the maximum output or higher and lower than 98% the maximum output. As shown in FIG. 4, when the carrier gas has a hydrogen gas ratio greater than 0% and 75% or less, the luminance provided by the light-emitting device 100 is 95% the maximum output or higher.

Thus, the light-emitting device 100 which has been fabricated under the conditions corresponding to area H1 provides high luminance. Furthermore, the light-emitting device 100 which has been fabricated under the conditions corresponding to area R1 provides higher luminance.

4-3. Comparison with Other Light-Emitting Devices

Figure 8:
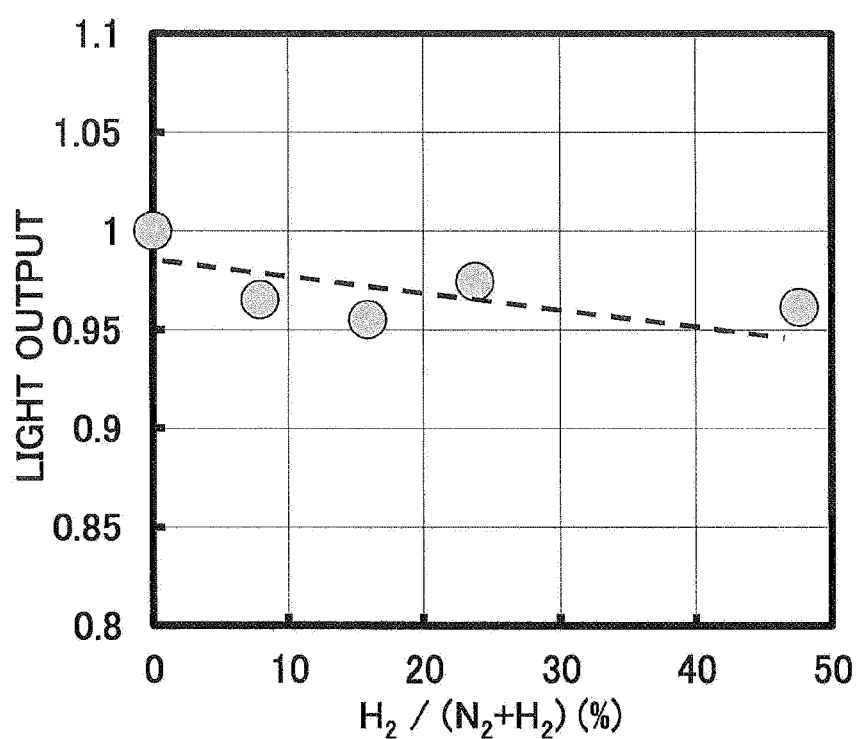
FIG. 8 is a graph showing the relationship between the hydrogen gas ratio of the carrier gas employed in the light-emitting layer formation step and the output of the light-emitting device produced through the embodiment of the production method.

In Comparative Example, a mixed gas formed of nitrogen gas and hydrogen gas is used as a carrier gas in the growth of the light-emitting layer 160. In the light-emitting device, each of the well layers 162 included the light-emitting layer 160 contains In. Thus, hydrogen gas unavoidably etches In contained in the well layers 162. Actually, as shown in FIG. 8, when a mixed gas formed of nitrogen gas and hydrogen gas is used as a carrier gas in the growth of the light-emitting layer 160, the light output of the produced light-emitting device is relatively low.

The light-emitting layer 160 of the light-emitting device 100 of the embodiment has a flatness higher than that of the light-emitting layer of the light-emitting device produced in Comparative Example. Also, since the light-emitting layer 160 of the light-emitting device 100 of the embodiment has suitable well layers 162, the light-emitting device of the embodiment emits light with higher luminance, as compared with the light-emitting device of Comparative Example.

5. Variations 5-1. Type of Light-Emitting Device

The light-emitting device 100 of the embodiment is a face-up-type light-emitting device. However, alternatively, the embodiment may also be applied to a flip-chip-type light-emitting device or a substrate-lift-off-type light-emitting device. In any case, essentially, a mixed gas formed of nitrogen gas and hydrogen gas is used as a carrier gas in the growth of the n-side superlattice layer 150.

5-2. Configuration of n-Side Superlattice Layer

The n-side superlattice layer 150 employed in the above embodiment has a stack structure in which stack units each being formed of the InGaN layer 151, the GaN layer 152, and the n-type GaN layer 153 are repeatedly deposited. Instead of the GaN layer 152, an AlGaN layer or AlGaN/GaN may also be used. Another nitride semiconductor layer may be formed on the n-type GaN layer 153. Thus, essentially, a mixed gas formed of nitrogen gas and hydrogen gas is used in the growth of semiconductor layers, each serving as a semiconductor layer included in the n-side superlattice layer 150 and other than the InGaN layer 151 or a semiconductor layer disposed directly above the InGaN layer 151.

5-3. Supply of Hydrogen Gas to GaN Layer Included in n-Side Superlattice Layer

Figure 9:
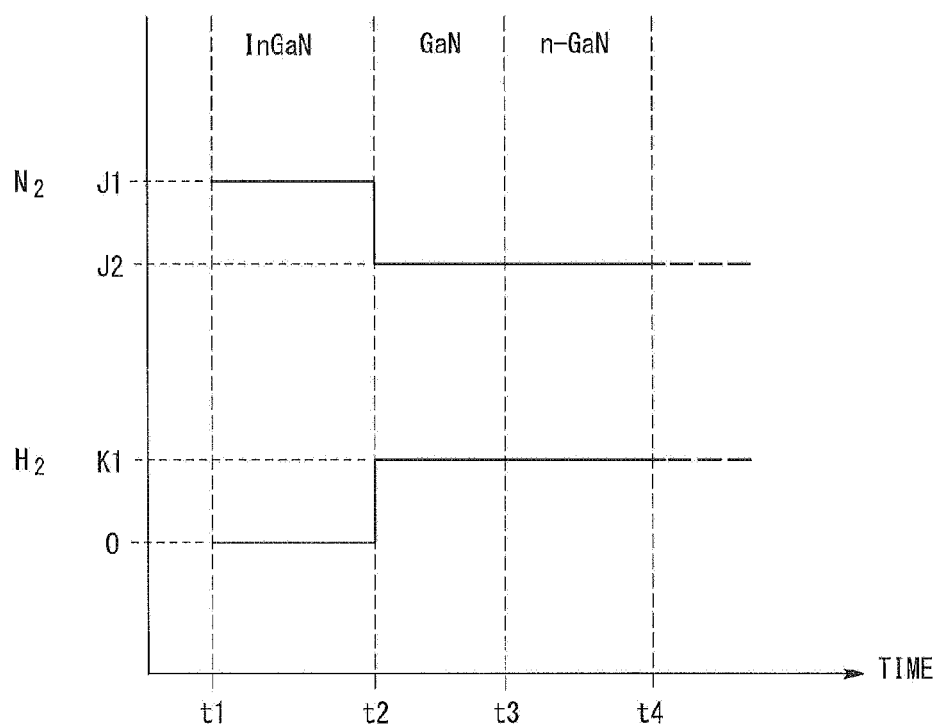
FIG. 9 is a graph showing the compositional ratio of the carrier gas in formation of the n-side superlattice layer employed in a modification of the embodiment.

In the above embodiment, nitrogen gas is used as a carrier gas in the growth of the GaN layer 152 serving as a first semiconductor layer. However, as shown in FIG. 9, in the n-side superlattice layer formation step, a second mixed gas formed of nitrogen gas and hydrogen gas may alternatively be supplied as a carrier gas to form the first semiconductor layer. The hydrogen gas ratio by volume of the second mixed gas is greater than 0% and 75% or less. Needless to say, similar to the case of the growth of the second semiconductor layer, the hydrogen gas ratio of the second mixed gas may be varied. In this case, in the growth of a semiconductor layer other than the InGaN layer 151 in the n-side superlattice layer 150, hydrogen gas is used as a carrier gas. In this case, however, hydrogen gas may cause slight damage on the InGaN layer 151 included in the n-side superlattice layer 150.

5-4. Combinations

The aforementioned variations may be combined with one another without any restriction.

6. Summary of the Embodiment

As described above, in the light-emitting device 100 of the embodiment, the InGaN layer 151 and the GaN layer 152 included in the n-side superlattice layer 150 are formed by use of nitrogen gas as a carrier gas. Also, the n-type GaN layer 153 included in the n-side superlattice layer 150 is formed by use of a mixed gas formed of nitrogen gas and hydrogen gas as a carrier gas. Through such a carrier gas supply mode, growth of the n-side superlattice layer 150 with high flatness is realized, whereby layers forming the light-emitting layer 160 which are formed on the n-side superlattice layer can be provided with flatness. In the growth of the light-emitting layer 160, addition of hydrogen to the carrier gas is not needed. Thus, the present techniques enable provision of a Group III nitride semiconductor light-emitting device production method which can form the light-emitting layer 160 with high flatness and which does not reduce the In proportion of the InGaN layer included in the light-emitting layer 160.

Notably, the above-described embodiment is given only for the purpose of illustration. Thus, needless to say, those skilled in the art can conduct various modifications and variations, so long as the gist of the present techniques falls within the scope of the techniques. The stack structure of the deposited semiconductor layers is not necessarily limited to ones illustrated in the drawings. The stack structure, the number of repetitions of the semiconductor layer formation, and other conditions may be selected without any restriction. The growth technique is not limited to metal-organic chemical vapor deposition (MOCVD), and other techniques may also be employed, so long as crystal layer growth is performed by use of a carrier gas.

What is claimed is:

1. A method for producing a Group III nitride semiconductor light-emitting device, the method comprising:
    (a) forming an n-type semiconductor layer on a substrate;
    (b) forming a light-emitting layer on the n-type semiconductor layer; and
    (c) forming a p-type semiconductor layer on the light-emitting layer,
    wherein the step (a) includes forming an n-side superlattice layer,
    in the formation of the n-side superlattice layer, at least an InGaN layer, a first semiconductor layer on the InGaN layer, and a second semiconductor layer on the first semiconductor layer are formed by repeating a plurality of times,
    in the formation of the InGaN layer, nitrogen gas and not hydrogen gas is supplied as a carrier gas,
    in the formation of the first semiconductor layer, nitrogen gas and not hydrogen gas is supplied as a carrier gas,
    in the formation of the second semiconductor layer, a first mixed gas formed of nitrogen gas and hydrogen gas is supplied as a carrier gas,
    the ratio by volume of hydrogen gas in the first mixed gas is greater than 0% and 75% or less, and
    in the formation of the light-emitting layer, nitrogen gas and not hydrogen gas is supplied as a carrier gas.

2. The Group III nitride semiconductor light-emitting device production method according to claim 1, wherein in the formation of the second semiconductor layer, the first mixed gas has a hydrogen gas ratio by volume of greater than 0% and 40% or less.

3. The Group III nitride semiconductor light-emitting device production method according to claim 2, wherein in the formation of the second semiconductor layer, the first mixed gas has a hydrogen gas ratio by volume of greater than 20% and 40% or less.

4. The Group III nitride semiconductor light-emitting device production method according to claim 1, wherein in the formation of the n-side superlattice layer, the n-side superlattice layer is grown such that the following conditions:

$$0 < A \leq 0.75,$$

$$0.167 \times B + 0.033 \leq A, \text{ and}$$

$$A \leq 0.167 \times B + 0.350,$$

wherein A represents a ratio of hydrogen gas in the first carrier gas, and B represents a growth rate (nm/s) of the semiconductor layer, are satisfied.

5. The group III nitride semiconductor light-emitting device production method according to claim 1, wherein in the formula of the n-side superlattice layer, the semiconductor layer growth rate satisfies the following formula:

$$0.8 \text{ nm/min} \leq B$$

where B represents a growth rate (nm/min) of the semiconductor layer.

6. The method of claim 1, further comprising:
    forming a buffer layer on the substrate, the forming of the n-type superlattice layer comprising forming the n-type superlattice layer on the buffer layer.

7. The method of claim 1, further comprising:
    forming an n-side electrostatic breakdown-preventing layer on the substrate, the n-side electrostatic breakdown-preventing layer comprising a non-doped i-GaN layer and an n-type GaN layer,
    wherein the forming of the n-type superlattice layer comprises forming the n-type superlattice layer on the n-side electrostatic breakdown-preventing layer.

8. The method of claim 1, wherein the first semiconductor layer comprises a GaN layer and the second semiconductor layer comprises an n-type GaN layer.

9. The method of claim 8, wherein a thickness of the InGaN layer is in a range from 0.3 nm to 1,000 nm, a thickness of the GaN layer is in a range from 0.3 nm to 10 nm, and a thickness of the n-type GaN layer is in a range from 0.3 nm to 100 nm.

10. The method of claim 1, wherein an amount of nitrogen gas supplied in the forming of the InGaN layer is the same as an amount of nitrogen gas supplied in the forming of the first semiconductor layer.

11. The method of claim 1, wherein an amount of nitrogen gas supplied in the forming of the second semiconductor layer is less than the amount of nitrogen gas supplied in the forming of the first semiconductor layer and the forming of the InGaN layer.

12. The method of claim 11, wherein a ratio by volume of hydrogen gas in the first mixed gas is greater than 0% and 75% or less, and
    wherein the forming of the light-emitting layer, includes supplying nitrogen gas and not hydrogen gas as a carrier gas.

13. A method for producing a Group III nitride semiconductor light-emitting device, the method comprising:
    (a) forming an n-type semiconductor layer on a substrate;
    (b) forming a light-emitting layer on the n-type semiconductor layer; and
    (c) forming a p-type semiconductor layer on the light-emitting layer,
    wherein the step (a) includes forming an n-side superlattice layer,
    in the formation of the n-side superlattice layer, at least an InGaN layer, a first semiconductor layer on the InGaN layer, and a second semiconductor layer on the first semiconductor layer are formed by repeating a plurality of times, in the formation of the InGaN layer, nitrogen gas and not hydrogen gas is supplied as a carrier gas, in the formation of the first semiconductor layer, a first mixed gas formed of nitrogen gas and hydrogen gas is supplied as a carrier gas, in the formation of the second semiconductor layer, a second mixed gas formed of nitrogen gas and hydrogen gas is supplied as a carrier gas, the ratio by volume of hydrogen gas in the first mixed gas is greater than 0% and 75% or less, the ratio by volume of hydrogen gas in the second mixed gas is greater than 0% and 75% or less, and in the formation of the light-emitting layer, nitrogen gas and not hydrogen gas is supplied as a carrier gas.

14. The Group III nitride semiconductor light-emitting device production method according to claim 13, wherein in the formation of the first semiconductor layer, the first mixed gas has a hydrogen gas ratio by volume of greater than 0% and 40% or less, in the formation of the second semiconductor layer, the second mixed gas has a hydrogen gas ratio by volume of greater than 0% and 40% or less.

15. The Group III nitride semiconductor light-emitting device production method according to claim 14, wherein in the formation of the first semiconductor layer, the first mixed gas has a hydrogen gas ratio by volume of greater than 20% and 40% or less, in the formation of the second semiconductor layer, the second mixed gas has a hydrogen gas ratio by volume of greater than 20% and 40% or less.

16. The Group III nitride semiconductor light-emitting device production method according to claim 13, wherein in the formation of the n-side superlattice layer, the n-side superlattice layer is grown such that the following conditions:

$0 < A \leq 0.75$, $0.167 \times B + 0.033 \leq A$, and $A \leq 0.167 \times B + 0.350$, wherein A represents a ratio of hydrogen gas in the first and the second carrier gas, and B represents a growth rate (nm/s) of the semiconductor layer, are satisfied.

17. The Group III nitride semiconductor light-emitting device production method according to claim 13, wherein the formation of the n-side superlattice layer, the semiconductor layer growth rate satisfies the following formula:

$0.8 \text{ nm/min} \leq B$ where B represents a growth rate (nm/min) of the semiconductor layer.

18. A method for producing a Group III nitride semiconductor light-emitting device, the method comprising:

forming an n-type superlattice layer on a substrate by repeatedly performing:

forming an InGaN layer, including supplying a nitrogen gas and not hydrogen gas as a carrier gas;

forming a first semiconductor layer on the InGaN layer, including supplying a nitrogen gas and not hydrogen gas as a carrier gas; and forming a second semiconductor layer on the first semiconductor layer, including supplying a first mixed gas formed of nitrogen gas and hydrogen gas as a carrier gas;

forming a light-emitting layer on the n-type superlattice layer; and forming a p-type semiconductor layer on the light-emitting layer.

* * * * *